(12) United States Patent
Chung

(10) Patent No.: US 6,472,124 B1
(45) Date of Patent: Oct. 29, 2002

(54) SELF-ALIGNED METAL-INSULATOR-METAL CAPACITOR FOR INTEGRATED CIRCUITS

(75) Inventor: Henry Chung, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 33 days.

(21) Appl. No.: 09/710,712

(22) Filed: Nov. 10, 2000

(51) Int. Cl.⁷ .................................................. G03F 7/36
(52) U.S. Cl. ...................... 430/314; 430/311; 430/313; 430/316; 430/317; 430/318; 430/319
(58) Field of Search ................................. 430/311, 313, 430/314, 316, 317, 318, 319

(56) References Cited

U.S. PATENT DOCUMENTS

| | | | |
|---|---|---|---|
| 5,371,700 A | * 12/1994 | Hamada | 365/149 |
| 5,576,240 A | 11/1996 | Radosevich et al. | 437/60 |
| 5,897,371 A | * 4/1999 | Yeh et al. | 438/633 |
| 5,914,851 A | * 6/1999 | Saenger et al. | 361/311 |
| 6,083,824 A | * 7/2000 | Tsai et al. | 438/629 |

\* cited by examiner

*Primary Examiner*—Mark F. Huff
*Assistant Examiner*—Nicole Barreca
(74) *Attorney, Agent, or Firm*—J.C. Patents

(57) ABSTRACT

A fabrication method for a self-aligned metal-insulator-metal capacitor is described. A plurality of metal interconnects is provided. A metal interconnect is etched back to form a recess in the metal interconnect using a patterned photoresist as a mask. A capacitor insulator is formed on the resulting structure, partially filling the recess in the metal interconnect and covering other metal interconnects. A top electrode metal layer is then deposited on the capacitor insulator, completely filling the recess in the metal interconnect. The top electrode metal layer that is formed above the recess of the metal interconnect is subsequently removed.

17 Claims, 5 Drawing Sheets

SELF-ALIGNED METAL-INSULATOR-METAL CAPACITOR FOR INTEGRATED CIRCUITS

BACKGROUND OF THE INVENTION

1. Field of the Invention

The present invention relates to a fabrication method for a capacitor. More particularly, the present invention relates to a fabrication method for a self-aligned metal-insulator-metal capacitor for integrated circuits.

2. Description of the Related Art

Capacitors are often used in integrated circuits for storing an electric charge. Capacitors basically comprise two conductive plates separated by an insulator. The capacitance or the amount of charge held by the capacitor per applied voltage depends upon the area of the plates, the distance between them, and the dielectric value of the insulator. Capacitors in integrated circuits are usually fabricated from polysilicon, metal to polysilicon or metal to polycide structures.

In many applications, as in analog-to-digital converters, it is desirable for capacitance not to vary with charges in voltage. A measure of the variation of capacitance with applied voltage is called the voltage coefficient of capacitance (VOC). Generally, VOC of capacitors used on integrated circuits is not zero and needs to be nulled. Various null circuit techniques have been employed to increase the precision of VOC's, these techniques, however, consume chip area and thus increase the cost.

Capacitors formed with metal-insulator-metal (MIM) layers have been shown to provide a capacitance that does not vary with voltage. The MIM capacitors are desirable because they provide depletion-free, high conductance electrodes suitable for high speed applications at the lowest cost. A conventional method for manufacturing a semiconductor device including a capacitor that is formed with metal-insulator-metal layers is first disclosed by Radosevich et a. in U.S. Pat. No. 5,576,240 and is described herein with reference to FIGS. 1A–1D.

As shown in FIG. 1A, a field oxide layer 102 is formed, for example, by local oxidation or deposition, on a silicon substrate 100. An optional polysilicon layer (not shown in Figure) is formed on the field oxide layer 102 as lead to conduct electric charge to and from the bottom plate to facilitate the incorporation of the capacitor into an integrated circuit. An interlevel dielectric layer 104 is formed on the field oxide layer 102. Openings are formed in the interlevel dielectric layer 104 in which a capacitor and a contact via are going to be formed.

Continuing to FIG. 1B, a layer of titanium (Ti) 106a and a layer of titanium nitride (TiN) 106b are deposited, preferably by sputtering deposition, in the openings in the interlevel dielectric layer 104, to form a bottom plate for the capacitor. A capacitor dielectric layer 108 is then deposited in the openings. The capacitor dielectric layer 108 can form from silicon nitride or a ferroelectric material.

As shown in FIG. 1C, the capacitor dielectric layer 108 is then patterned using a photoresist layer 110a. The capacitor dielectric layer 108 in the contact via 109 is removed.

Referring to FIG. 1D, the photoresist layer 110a (as in FIG. 1C) is stripped off and a layer of aluminum 112 deposited. Photoresist layers 110b and 110c are then formed on the aluminum layer 112 to define gaps to expose portions of the integrated circuit to an etchant.

The aluminum layer 112 is then over etched sufficiently to remove portions of the dielectric layer 108 and the titanium-titanium nitride layer 106 positioned at the gaps as illustrated in FIG. 1E. Structure 120, formed according to the conventional approach, is a contact via comprising conductive layers of aluminum 112 and Ti/TiN 106, and the structure 140 is a capacitor comprising the titanium-titanium nitride layer 106 as the low electrode, the capacitor dielectric layer 108 and the aluminum layer 112 as top electrode.

Accordingly, the method of manufacturing a conventional semiconductor device including a capacitor as described above uses multiple masking and etching steps for the patterning of capacitor, greatly increase the complexity of the manufacturing process. The probabilities of misalignment, leading to the formation of a defective device also increases. Additionally, each masking and etching step is performed using lithography, which is a relatively expensive step in the manufacturing of semiconductor devices. The MIM capacitor formed according to the conventional approach, moreover, does not provide a smooth topography, greatly increasing the processing difficulties of the subsequent layers.

SUMMARY OF THE INVENTION

Based on the foregoing, a fabrication method for a self-aligned metal-insulator-metal capacitor using a metal interconnect as the bottom electrode is provided, wherein a single self-aligned masking is required for the patterning of capacitor.

According to a preferred embodiment of the present invention for fabricating a self-aligned metal-insulator-metal capacitor, a plurality of damascene metal interconnects are formed in an inter-metal dielectric layer. A metal interconnect is etched back to form a recess in the metal interconnect. A conformal insulation layer is then formed on the inter-metal dielectric layer, covering other metal interconnects and partially filling the recess in the metal interconnect. A metal layer is further deposited on the insulation layer, completely filling the recess in the metal interconnect. The excess metal layer formed on the surface of the insulating layer above the recess of the metal interconnect is subsequently removed.

Accordingly, the present invention is compatible with the damascene backend processing, wherein the MIM capacitor uses the damascene metal layer as the bottom electrode. Additionally, only a single mask is used for the patterning of the capacitor. The single capacitor masking, namely the mask that is used for the etching back of the metal interconnect, is also self-aligned. Moreover, the MIM capacitor of the present invention is formed in the recess of the metal interconnect, the topography of the resulting structure is thus relatively smooth, reducing the difficulties in the manufacturing of the subsequent layers.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

The fabrication method for a self-aligned metal-insulator-metal (MIM) capacitor for integrated circuits, respectively in accordance with the present invention is described with reference to FIGS. 2A to 2F.

Figure 1A:
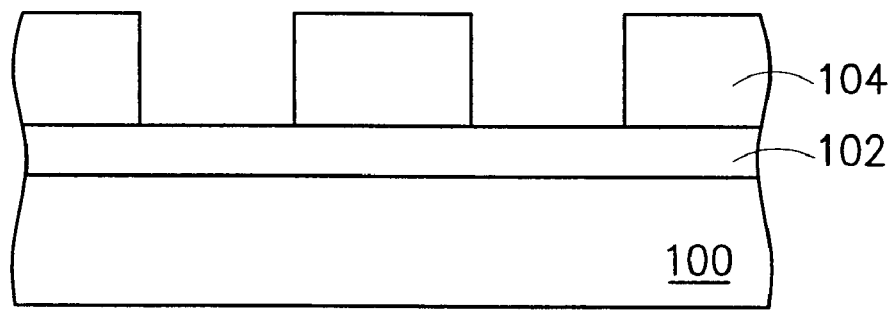
FIGS. 1A–1E are schematic, cross-sectional views showing the manufacturing of a MIM capacitor according to the prior art.
Figure 1B:
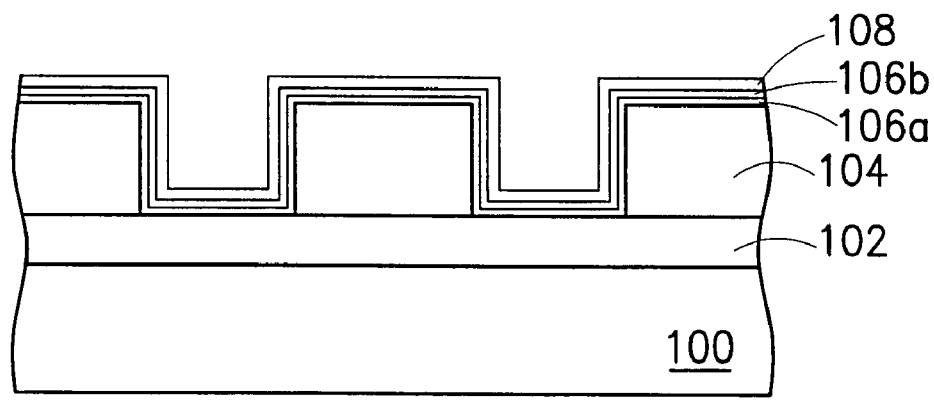
Figure 1C:
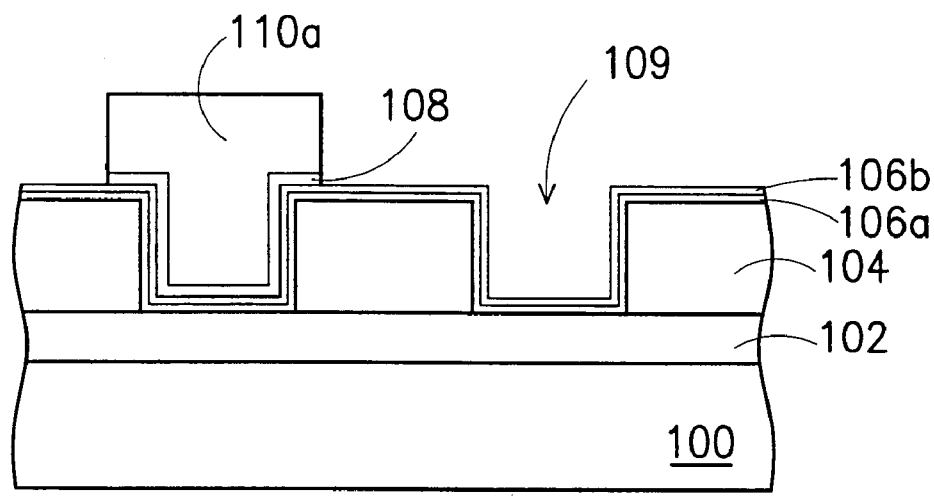
Figure 1D:
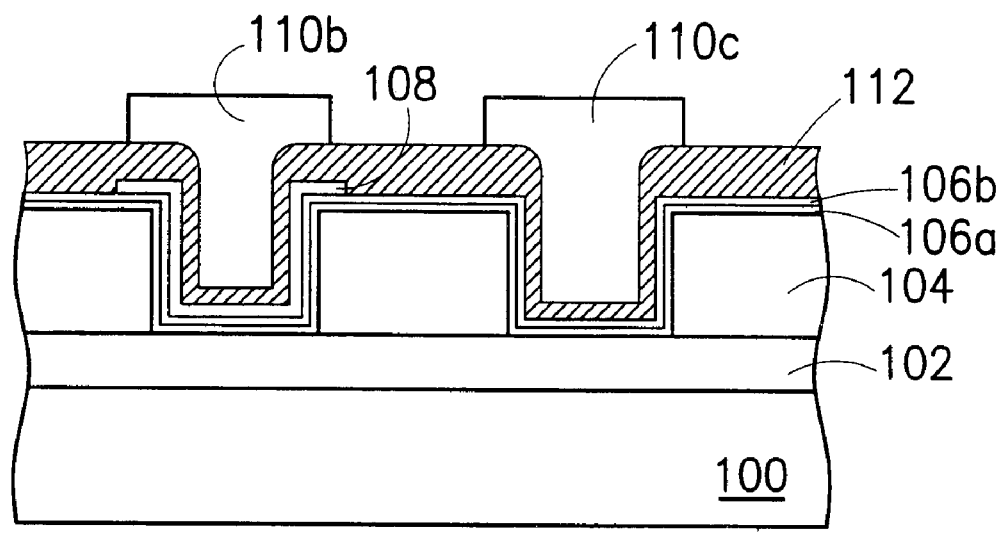
Figure 1E:
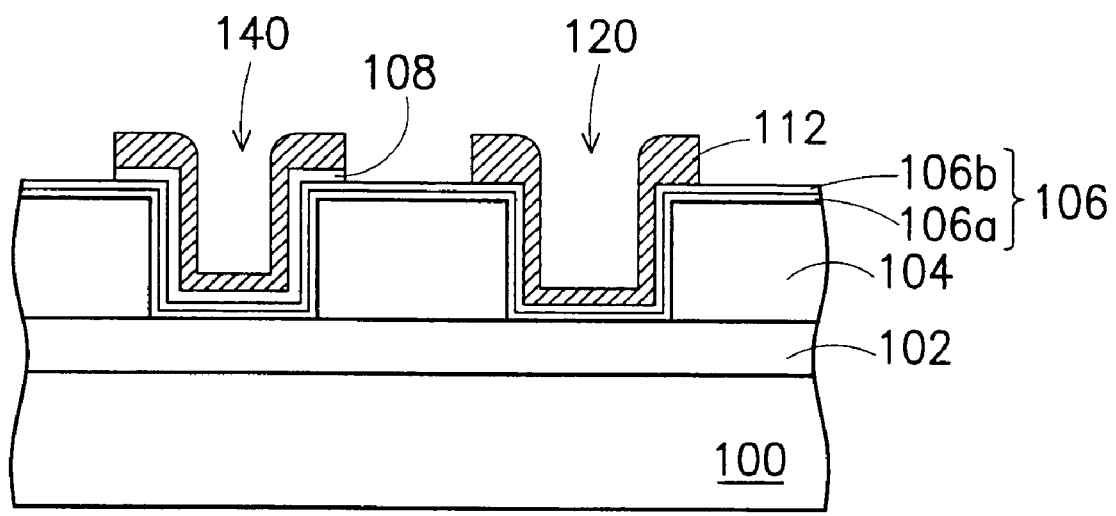
Figure 2A:
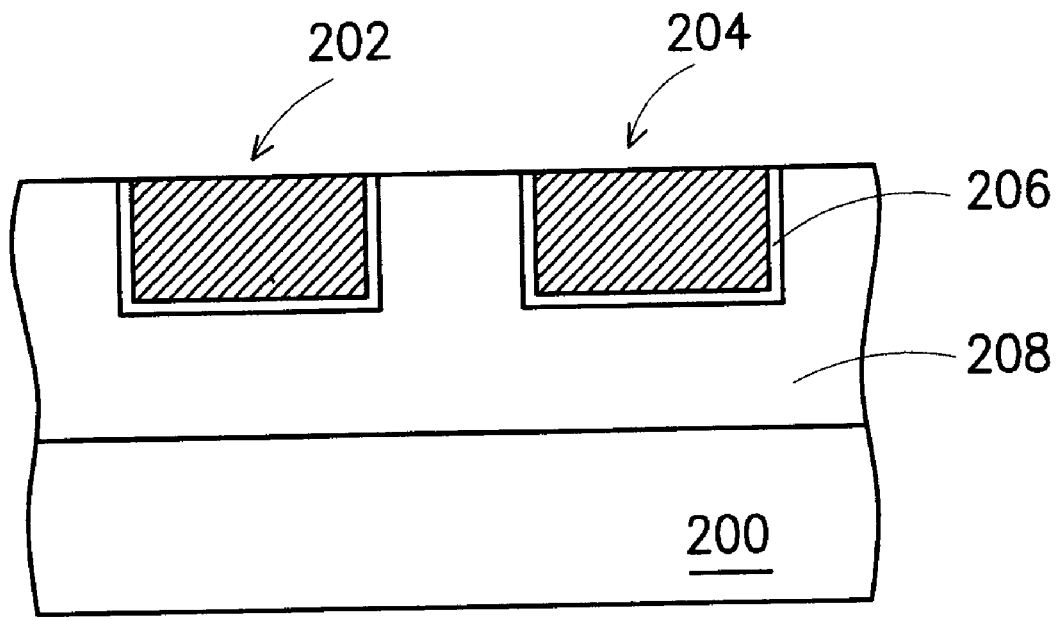
FIGS. 2A–2F are schematic, cross-sectional views showing the manufacturing of a MIM capacitor according to a preferred embodiment of the present invention.

Referring to FIG. 2A, a plurality of metal interconnects 202, for example, copper interconnects, is provided. The metal interconnects 202, which can be damascene structures, are formed by, for example, forming the dielectric layer 208 on a substrate 200, followed by forming a plurality of openings (not shown in Figure) in the dielectric layer 208. The dielectric layer 208 is formed by, for example, plasma enhanced chemical vapor deposition (PECVD), and is served as the inter-metal interconnect dielectrics. A conformal barrier layer (not shown in Figure) is then formed to cover the dielectric layer 208 and the openings, followed by forming a conductive layer (not shown in Figure), such as copper, to cover the barrier layer and to fill the openings. The barrier layer, such as titanium nitride (TiN), tungsten nitride (WN) or tantalum nitride (TaN), is formed by, for example, physical vapor deposition or chemical vapor deposition. The conductive layer is formed by, for example, sputtering deposition. Thereafter, a planarization procedure, for example, chemical mechanical polishing, is conducted to remove the parts of the barrier layer and the conductive layer on the surface of the dielectric layer 208 and to form the barrier layer 206 and a plurality of metal interconnects 202, 204.

Figure 2B:
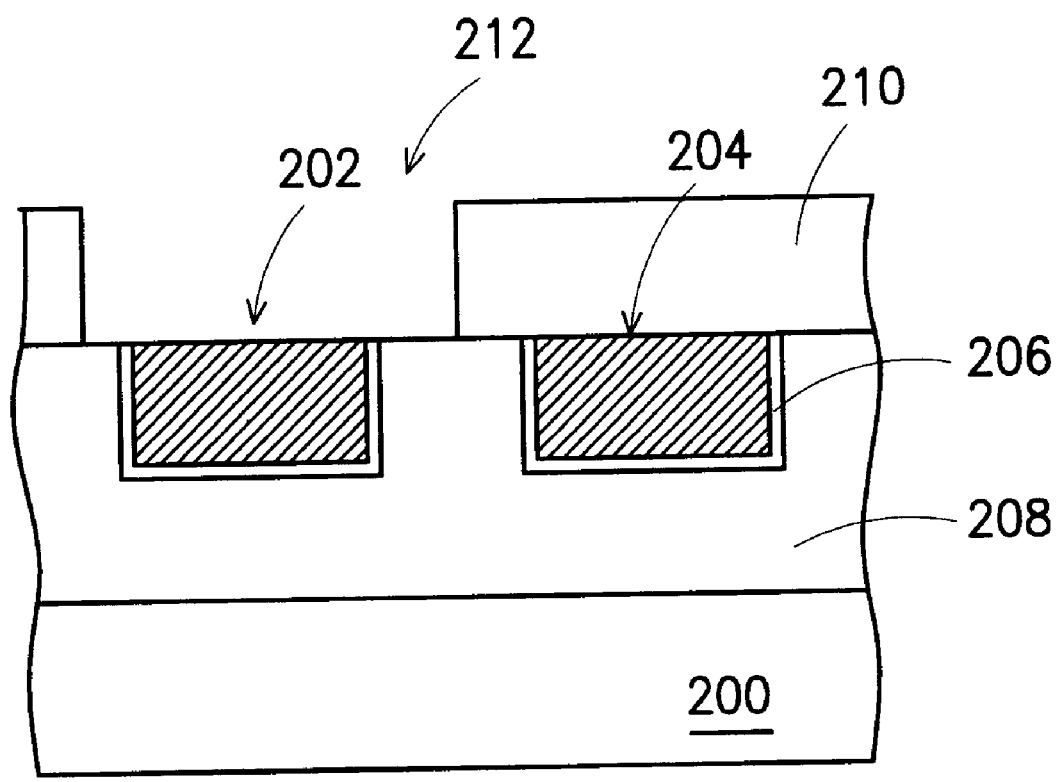

As shown in FIG. 2B, a photoresist layer (not shown in Figure) is formed on the dielectric layer 208, covering the metal interconnects 202, 204. Conventional photolithography and etching processes are then conducted to pattern the photoresist layer, forming an opening 212 in the photoresist layer 210 to expose the metal interconnect 202. The exact dimension of the opening 212 is not critical, as long as the metal interconnect 202 is completely exposed.

Figure 2C:
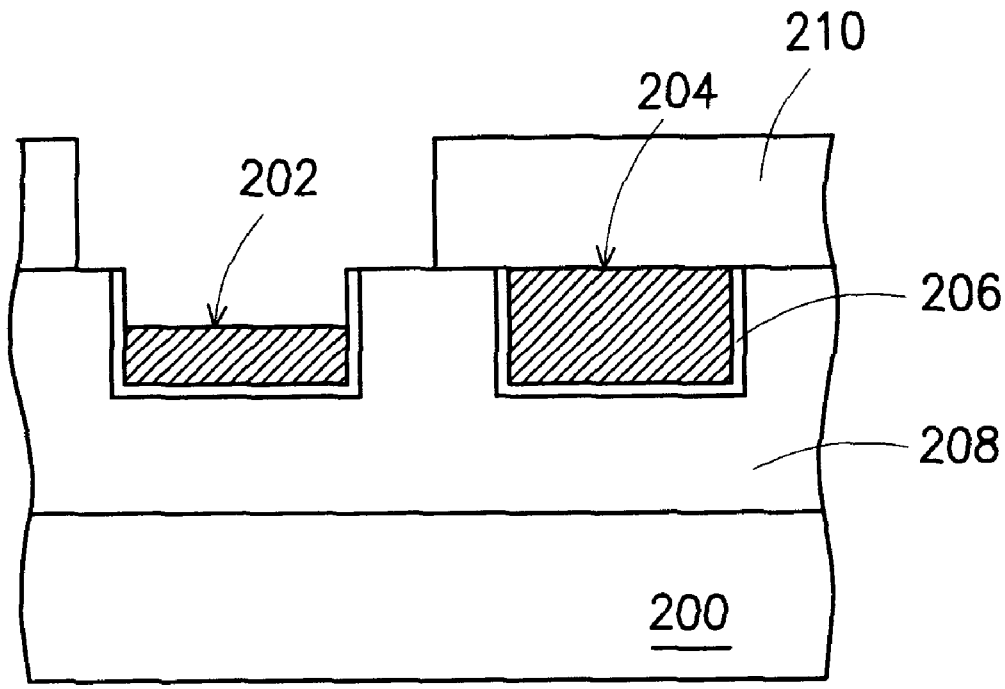

Continuing to FIG. 2C, using the patterned photoresist layer 210 as a mask, the metal interconnect 202 is then etched back to form a recess in the metal interconnect 202. The etching back of the metal interconnect 202 is conducted, for example, using the plasma etching techniques with a high metal to dielectric material etching selectivity ratio.

Figure 2D:
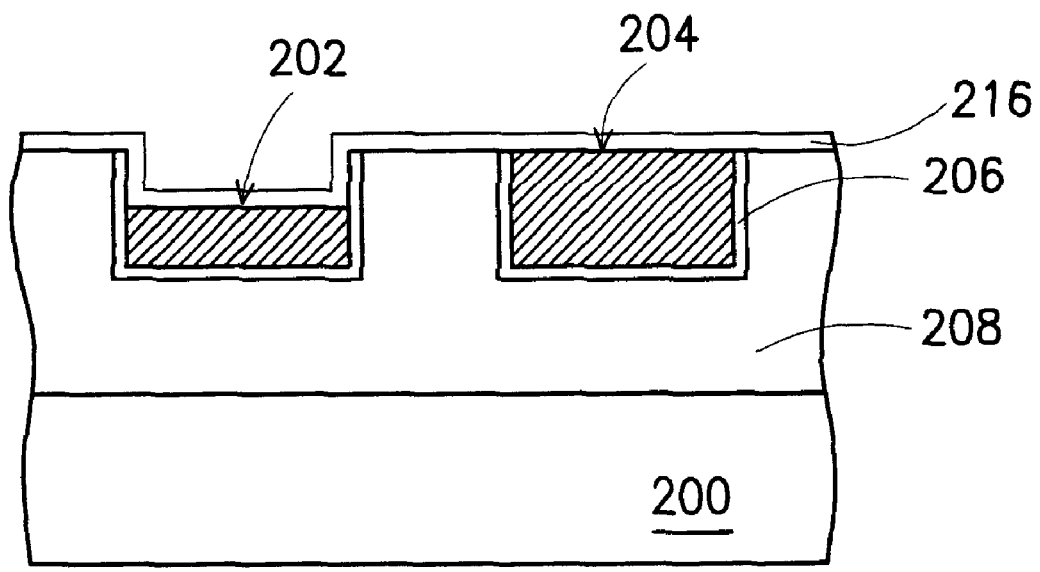

Referring to FIG. 2D, the patterned photoresist layer 210 is stripped from the surface of the dielectric layer 208 and the metal interconnect 204 using organic or specialty strippers to prevent the attack of the metal layer to take place. Thereafter, a conformal insulating layer 216 is formed on the dielectric layer 208. The insulating layer 216, which also serves as the capacitor dielectric layer, can form from a ferroelectric material such as PZT (lead zirconate titanate), PLZT (lead lanthanum zirconate titanate), SBT (strontium bismuth tantalate) or BS (bismuth strontium) by a sputtering process or the alike.

Figure 2E:
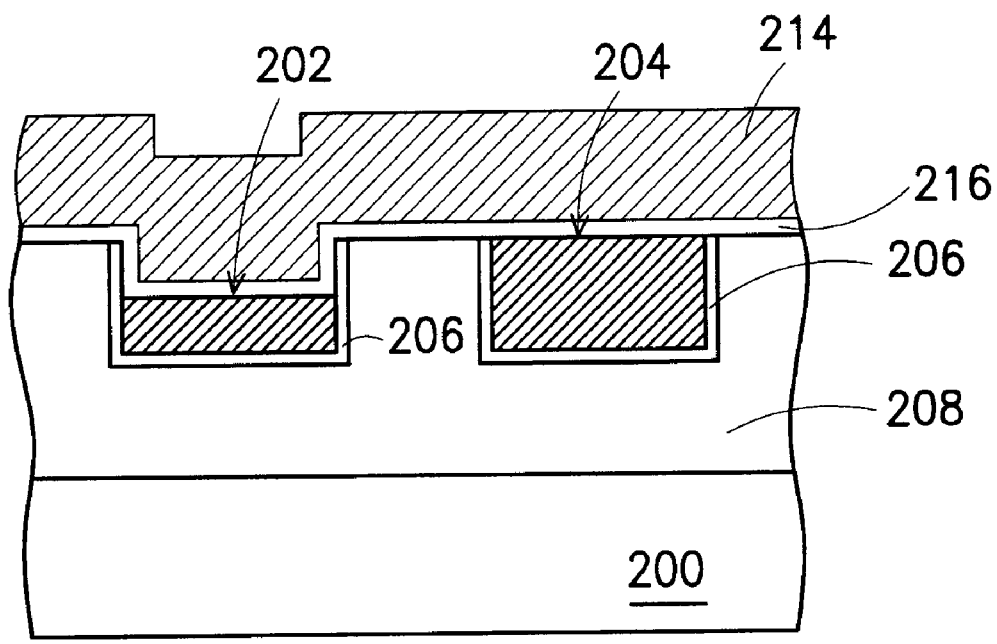

Referring to FIG. 2E, a metal layer 214 is then formed on the insulating layer 216. The metal layer 214, formed by, for example, physical vapor deposition or sputtering deposition, is sufficiently thick to completely fill the recess in the metal interconnect 202. The metal layer 214, which serves as the top electrode of the MIM capacitor, can form with platinum, iridium, iridium oxide or ruthenium.

Figure 2F:
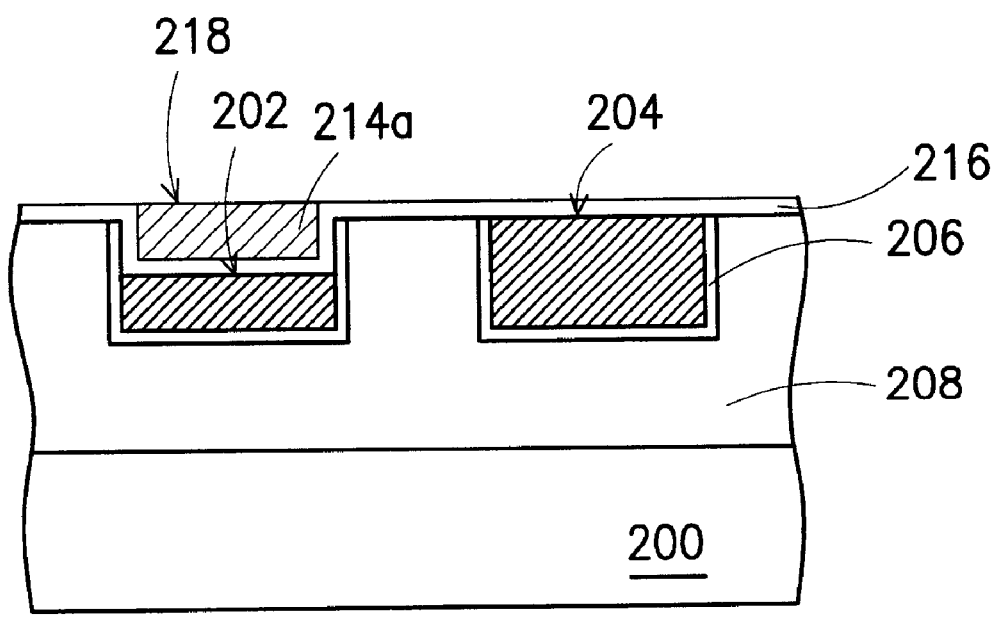

Continuing to FIG. 2F, the portion of the metal layer 214 (as in FIG. 2E) on the surface of the insulating layer 216 above the recess of the metal interconnect 202 is removed, for example, by chemical mechanical polishing using the insulating layer 216 as a stop layer. The metal layer 214a remaining in the recess forms the top electrode metal of the MIM capacitor 218. The MIM capacitor 218 of the present invention thus comprises the metal interconnect 202 as the bottom electrode, the capacitor dielectric layer 216, and metal layer 214a as the top electrode metal.

Based on the foregoing, the present invention is compatible with the damascene backend processing, wherein the MIM capacitor uses the damascene metal layer as the bottom electrode. Furthermore, only a single mask is used for the patterning of the capacitor, greatly reduces the processing steps and the manufacturing cost. The single capacitor masking, namely the mask that is used for the etching back of the metal interconnect, in addition, is self-aligned. Moreover, the MIM capacitor of the present invention is formed in the recess of the metal interconnect, the topography of the resulting structure is thus relatively smooth, which greatly reducing the difficulties in the manufacturing of the subsequent layers.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a metal-insulator-metal capacitor, wherein a plurality of metal interconnects formed in an inter-metal dielectric layer is provided, comprising:

forming a patterned photoresist layer on the inter-metal dielectric layer, wherein the patterned photoresist layer comprises an opening that exposes a metal interconnect;

back-etching the metal interconnect to form a recess in the metal interconnect using the patterned photoresist as an etching mask;

removing the patterned photoresist layer;

forming an insulating layer on the inter-metal dielectric layer, covering other metal interconnects and partially filling the recess of the metal interconnect;

forming a metal layer on the insulating layer, wherein the metal layer completely fills the recess of the metal interconnect; and removing the metal layer on the insulating layer that is above the recess of the metal interconnect.

2. The method according to claim 1, wherein the metal interconnects include copper interconnects.

3. The method according to claim 1, wherein the metal interconnects include damascene interconnects.

4. The method according to claim 3, wherein forming the damascene interconnects further comprising:

forming a plurality of openings in the inter-metal dielectric layer;

forming a conformal barrier layer to cover the inter-metal dielectric layer and the openings;

forming a conductive layer to cover the barrier layer and to fill the openings; and performing a planarization procedure to remove parts of the barrier layer and the conductive layer on the surface of the inter-metal dielectric layer.

5. The method according to claim 4, wherein the conductive layer includes a sputtering deposited copper layer.

6. The method according to claim 4, wherein the barrier layer is titanium nitride layer, tungsten nitride layer or tantalum nitride layer.

7. The method according to claim 4, wherein the barrier layer is formed by physical vapor deposition or chemical vapor deposition.

8. The method according to claim 1, wherein the insulating layer includes a sputtering deposited ferroelectric material.

9. The method according to claim 8, wherein the sputtering deposited ferroelectric material is selected from the group consisting of PZT, PLZT, SBT and BS.

10. The method according to claim 1, wherein the metal layer is platinum, iridium, iridium oxide or ruthenium.

11. The method according to claim 1, wherein the metal layer is formed by sputtering deposition or physical vapor deposition.

12. The method according to claim 1, wherein the metal layer on the insulating layer that is above the recess of the metal interconnect is removed by chemical mechanical polishing.

13. The method according to claim 12, wherein chemical mechanical polishing the metal layer on the insulating layer that is above the recess of the metal interconnect includes using the insulating layer as a stop layer.

14. A fabrication method of a metal-insulator-metal capacitor, comprising:

forming a damascene metal interconnect in an inter-metal dielectric layer;

back etching the damascene metal interconnect to form a recess in the metal interconnect;

depositing a capacitor insulator in the recess formed in the metal interconnect, wherein the capacitor insulator only partially fills the recess; and filling completely the recess formed in the metal interconnect with a metal layer.

15. The fabrication method according to claim 14, wherein the capacitor insulator includes a sputtering deposited ferroelectric material.

16. The fabrication method according to claim 14, wherein the damascene metal interconnect includes a copper interconnect.

17. The fabrication method according to claim 14, wherein the metal layer includes an electrode metal layer selected from the group consisting of platinum, iridium iridium oxide or ruthenium.

* * * * *